United States Patent [19]
Schlotzhauer et al.

[11] 4,322,688
[45] Mar. 30, 1982

[54] CASCODE FEED-FORWARD AMPLIFIER

[75] Inventors: Kenneth G. Schlotzhauer, Beaverton; Arthur J. Metz, Gervais, both of Oreg.

[73] Assignee: Tektronix, Inc., Beaverton, Oreg.

[21] Appl. No.: 83,873

[22] Filed: Oct. 11, 1979

[51] Int. Cl.³ .............................................. H03F 3/45
[52] U.S. Cl. .................................... 330/252; 330/149; 330/151; 330/311
[58] Field of Search ................ 330/149, 151, 252, 311

[56] References Cited
U.S. PATENT DOCUMENTS

| | | | |
|---|---|---|---|
| 3,689,752 | 9/1972 | Gilbert | 330/252 X |
| 4,048,577 | 9/1977 | Shinn | 330/254 |
| 4,146,844 | 3/1979 | Quinn | 330/151 X |

*Primary Examiner*—James B. Mullins
*Attorney, Agent, or Firm*—George T. Noe

[57] ABSTRACT

The cascode feed forward amplifier is modified to correct alpha-induced error. A pair of resistors are serially disposed between the bases of a pair of common-base amplifiers to generate an error voltage proportional to the input signal. The error voltage is applied to the correction amplifier to provide an appropriate correction current.

2 Claims, 1 Drawing Figure

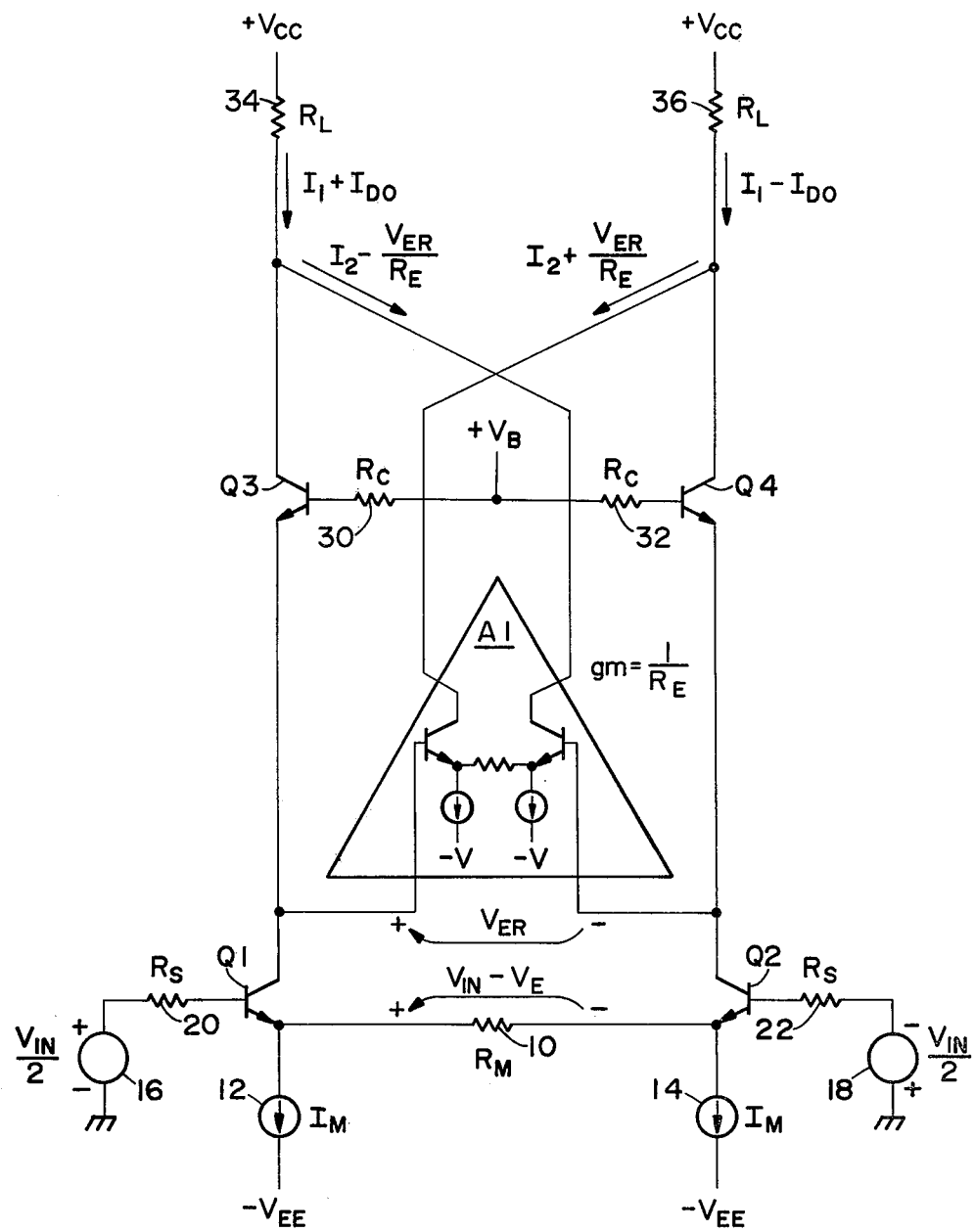

4,322,688

CASCODE FEED-FORWARD AMPLIFIER

BACKGROUND OF THE INVENTION

High-precision wideband amplifiers have broad application in modern electronic equipment, particularly measurement instruments. A trend in designing high-precision differential amplifiers is to incorporate mechanisms within the circuit to significantly reduce or cancel non-linearity and thermal distortion error which is inherent in the physical properties of semiconductor pn junctions. One such amplifier design which provides vastly improved performance is the cascode feed-forward amplifier taught by Quinn in U.S. Pat. No. 4,146,844, which is assigned to assignee of the present invention. The Quinn feed-forward amplifier employs a correction channel which senses pn junction distortion of a main channel and injects an error-correction signal into a pair of output nodes. The main channel, however, is a cascode amplifier having at least four transistors in the signal-current path, and as a consequence of the sub-unity value of alpha, the transconductance of the amplifier contains a slight residual error which results in a non-linear and thermally-dependent gain reduction.

SUMMARY OF THE INVENTION

In accordance with the present invention, the cascode feed forward amplifier is modified to correct alpha-induced error. Alpha ($\alpha$) is the common-base forward current transfer ratio, that is, the ratio of collector current to emitter current. Alpha is necessarily less than unity, however slight, because a part of the emitter current flows through the base-emitter junction as base current. Therefore, the conduction of the transistors in the correction channel is adjusted so that a current equal to the base current losses is added to the signal current at the output nodes. This is achieved by the addition of two resistors of predetermined value to add an error voltage across the correction channel inputs which depends upon the base currents of the cascode transistors of the main channel, as well as by carefully scaling and matching various components and area ratios within the feed-forward amplifier.

It is therefore one object of the present invention to provide an improved cascode feed-forward amplifier.

It is another object to provide a cascode feed-forward amplifier in which gain-reduction error due to transistor alpha is corrected.

Other objects and advantages of the present invention will become apparent upon a reading of the following description when taken in conjunction with the drawing.

BRIEF DESCRIPTION OF THE DRAWING

This single FIGURE is a schematic diagram of the preferred embodiment in accordance with the present invention.

DETAILED DESCRIPTION OF THE PREFERRED EMBODIMENT

In the single FIGURE, a cascode feed-forward amplifier is shown in which a main amplifier channel comprises four transistors, Q1, Q2, Q3, and Q4, and a correction channel comprises an amplifier A1. The emitters of transistors Q1 and Q2 are coupled together through a resistor 10, and are connected to a suitable source of negative voltage $-V_{EE}$ through respective constant current sinks 12 and 14. The bases of transistors Q1 and Q2 are coupled respectively to time-varying voltage sources 16 and 18, which in combination produce a differential input signal $V_{IN}$, through resistors 20 and 22. Resistors 20 and 22, the values of which are shown as $R_S$, represent the source impedance of the voltage sources 16 and 18, and may include physical input resistors. Transistors Q1 and Q2 are operated as a transconductance amplifier; that is, they convert the input voltage signal $V_{IN}$ to a current signal.

Transistors Q3 and Q4 form a common-base amplifier stage. The bases of transistors Q3 and Q4 are coupled to a source of bias voltage $+V_B$ through resistors 30 and 32 respectively, the collectors thereof are coupled to a suitable source of collector supply voltage $+V_{CC}$ through load resistors 34 and 36 respectively, and the emitters thereof are connected to the collectors of transistors Q1 and Q2 respectively.

The correction amplifier A1, which may suitably be a differential amplifier as shown, has a pair of inputs connected respectively to the emitters of transistors Q3 and Q4, and a pair of collectors crosscoupled to the collectors of transistors Q4 and Q3, respectively. Operation of correction amplifier A1 in the cascode feed-forward amplifier context is fully disclosed by Patrick A. Quinn in U.S. Pat. No. 4,146,844.

For the transconductance amplifier shown, it is desired that the output signal current $I_{DO}$ be equal to the input voltage divided by the resistance $R_M$, or $I_{DO} = V_{IN}/R_M$. Due to alpha-induced error, however, not all of the signal current generated in the emitter circuit of transistors Q1 and Q2 reaches the collectors of transistors Q3 and Q4. Alpha ($\alpha$) is the common-base forward current transfer ratio from emitter to collector. Since part of the emitter current flows through the base-emitter junction as base current, alpha is necessarily less than unity, however slight, or $\alpha = I_C/I_E > 1$.

To overcome this loss of signal current, the conduction of the transistors in correction amplifier A1 is adjusted so that a current equal to the base signal current losses is added to the signal current from the collectors of transistors Q3 and Q4 at the output nodes. Resistors 30 and 32 each having a predetermined value $R_C$ are added between the bases of transistors Q3 and Q4 to develop at the emitters thereof, and hence, at the inputs of correction amplifier A1, an error voltage $V_{ER}$ which varies proportionately and in proper polarity relationship with the input signal, $V_{IN}$. The transconductance of amplifier A1 is $g_m = 1/R_E$, and the output current therefrom is $I_2 \pm V_{ER}/R_E$, where $R_E$ is the transresistance of amplifier A1, and $I_2$ is the available standing current at each output. Thus, the $V_{ER}/R_E$ term represents the correction current added or subtracted at the output nodes to provide the corrected output currents $I_1 \pm I_{DO}$, where $I_1$ is the total standing current of the cascode feedforward amplifier and $I_{DO} = V_{IN}/R_M$.

The appropriate values of $R_C$ may be determined as follows:

$$R_C = \frac{1-\alpha}{2\alpha} R_M + \frac{1}{\alpha} R_S \qquad (1)$$

where the values of $R_M$ and $R_S$ are known and alpha is the same for all four transistors Q1, Q2, Q3, and Q4, or $\alpha = \alpha_1 = \alpha_2 = \alpha_3 = \alpha_4$. It is therefore important that all of the components within the feed-forward amplifier be carefully matched when implementing in integrated circuits form. In particular, the following design specifications should be met. The transresistance $R_E$ of amplifier A1 should be equal to the value of emitter resistance $R_M$. The thermal conditions of transistors Q3 and Q4 should be equal to the thermal conditions of transistors Q1 and Q2 respectively, so that $T_3=T_1$ and $T_4=T_2$. The areas of transistors Q3 and Q4 should be scaled by a factor of $\alpha$ with the areas of transistors Q1 and Q2 so that $I_{S3}=\alpha I_{S1}$ and $I_{S4}=\alpha I_{S2}$, where $I_S$ is the forward saturation current of each transistor.

Provided the above conditions are met, the output signal current is $$I_{DO}=\alpha 2\left(\frac{V_{IN}-V_E}{R_M}\right) - \frac{V_{ER}}{R_E} = \frac{V_{IN}}{R_M}, \quad (2)$$

where $$(V_{IN}-V_E) = \frac{V_{IN}-(V_{BE1}-V_{BE2})}{1+2(1+\alpha R_S/R_M)}. \quad (3)$$

While we have shown and described a preferred embodiment of our invention, it will be apparent to those skilled in the art that many changes may be made without departing from our invention in its broader aspects. For example, the value of $R_C$ could be designed to compensate for different source resistances $R_S$ as well as alpha-induced error. The appended claims therefore cover all such changes and modifications as fall therewithin.

We claim:

1. A feed-forward amplifier, comprising:

a main amplifier comprising an emitter coupled pair of transistors for converting an input signal to a differential signal current;

a common-base amplifier stage coupled to said main amplifier, said common-base amplifier stage comprising a pair of transistors through which said differential signal current passes;

a correction amplifier having a pair of inputs coupled between said main amplifier and said common-base amplifier stage, and a pair of outputs cross-coupled in a current-aiding sense with the outputs of said common-base amplifier; and means for altering the conduction of said correction amplifier to compensate for alpha-induced error in the differential signal current path, said means comprising a pair of resistors having a predetermined resistance value serially disposed between the bases of said pair of transistors of said common-base amplifier stage, across which resistors an error voltage proportional to said input signal is developed.

2. An amplifier in accordance with claim 1 wherein said pairs of transistors of said main amplifier and said common base amplifier have equal alpha ($\alpha$) characteristics, and said pair of resistors each have a value equal to $$\frac{1-\alpha}{2\alpha}R_M + \frac{1}{\alpha}R_S,$$

where $R_M$ is the resistance between the emitters of said pair of transistors of said main amplifier, and $R_S$ is the input signal source resistance.

* * * * *